United States Patent [19]

Axel et al.

[11] Patent Number: 5,217,016
[45] Date of Patent: Jun. 8, 1993

[54] METHOD FOR GENERATING OPTIMAL PULSES FOR MAGNETIC RESONANCE IMAGING USING SPATIAL MODULATION OF MAGNETIZATION

[75] Inventors: Leon Axel, Philadelphia; Meir Shinnar, Bala Cynwyd, both of Pa.

[73] Assignee: The trustees of the University of Pennsylvania, Philadelphia, Pa.

[21] Appl. No.: 685,915

[22] Filed: Apr. 15, 1991

Related U.S. Application Data

[63] Continuation-in-part of Ser. No. 254,454, Oct. 6, 1988, Pat. No. 5,054,489.

[51] Int. Cl.$^5$ .............................................. A61B 5/055
[52] U.S. Cl. ................................ 128/653.2; 324/309; 364/413.13
[58] Field of Search .................. 128/653.2, 653.3, 695; 324/306, 309, 312; 364/413.13

[56] References Cited

U.S. PATENT DOCUMENTS 5,054,489 10/1991 Axel et al. ..................... 128/695 X Primary Examiner—Ruth S. Smith
Attorney, Agent, or Firm—Woodcock Washburn Kurtz Mackiewicz & Norris

[57] ABSTRACT

A technique for generating "optimal" radio frequency pulses for use in creating SPAMM imaging stripes. The MR imaging operator is given an opportunity to select the desired stripe parameters for the SPAMM imaging stripe so that the resulting SPAMM imaging stripe will have the desired narrowness, sharpness, flatness and the like. These parameters are then used by an optimal pulse generating system of the invention to generate the input radio frequency pulse sequence which will produce the desired stripes. This technique allows a large family of pulse sequences with fairly similar performance to be generated by simply adjusting the relative weightings of criteria such as the narrowness, sharpness, flatness and the like for the SPAMM stripes.

9 Claims, 5 Drawing Sheets

Microfiche Appendix Included
(1 Microfiche, 16 Pages)

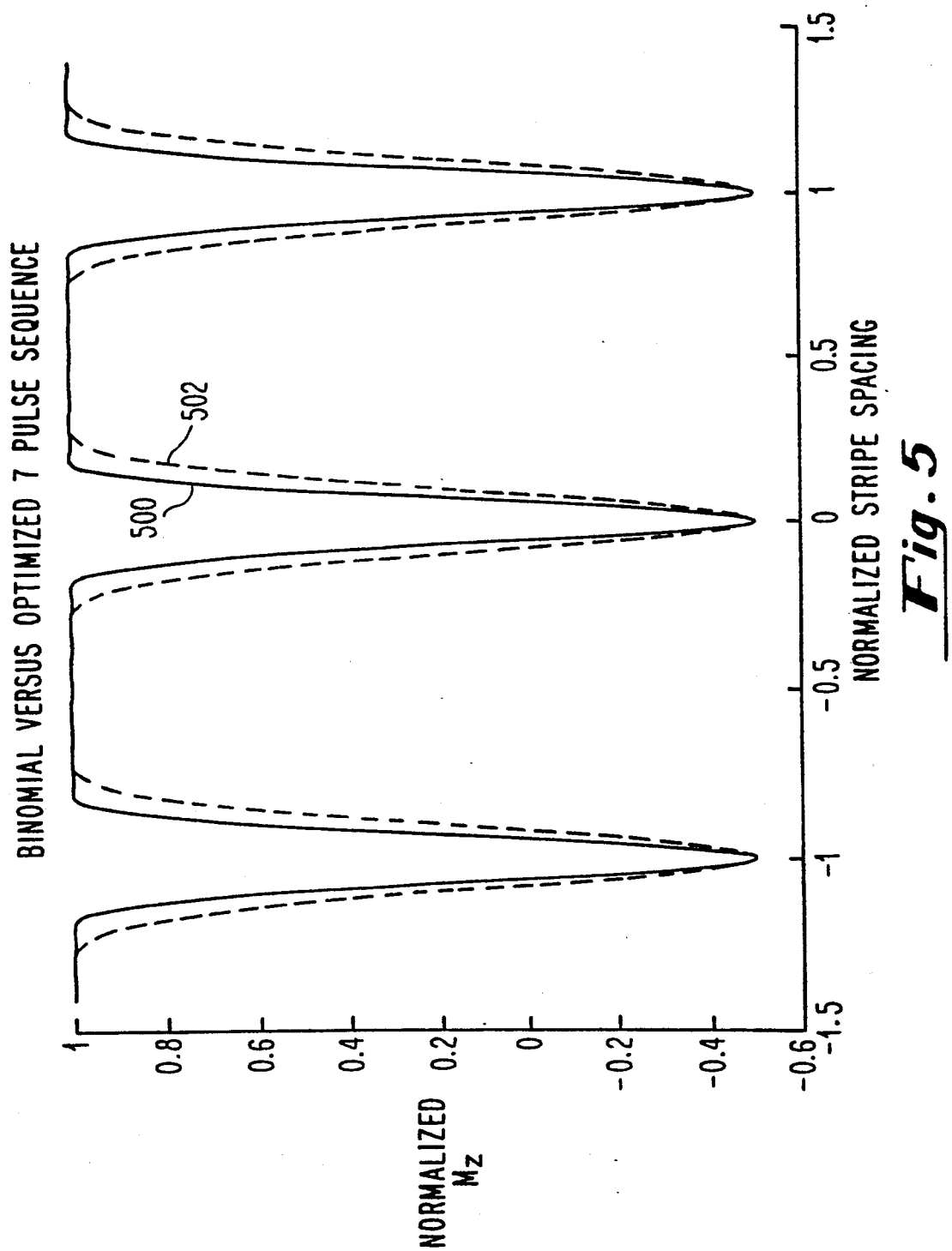

METHOD FOR GENERATING OPTIMAL PULSES FOR MAGNETIC RESONANCE IMAGING USING SPATIAL MODULATION OF MAGNETIZATION

CROSS-REFERENCE TO RELATED APPLICATIONS

This application is a continuation-in-part application of co-pending U.S. patent application Ser. No. 07/254,454, filed Oct. 6, 1988 and entitled "Magnetic Resonance Imaging Using Spatial Modulation of Magnetization" now U.S. Pat. No. 5,054,489.

This application is also related to co-pending U.S. patent application Ser. No. 07/655,077, filed Feb. 14, 1991 and entitled "Methods of Generating Pulses For Selectively Exciting Frequencies", (now U.S. Pat. No. 5,153,515), which is a continuation-in-part application of U.S. patent application Ser. No. 07/471,707, filed Jan. 29, 1990, now abandoned, which is, in turn, a continuation application of U.S. patent application Ser. No. 07/176,429, filed Apr. 1, 1988, now abandoned.

COPYRIGHT NOTICE AND AUTHORIZATION

A portion of the disclosure of this patent document (APPENDIX A) is available on a microfiche appendix of 1 sheet, 16 frames and contains material which is subject to copyright protection. The copyright owner has no objection to facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention relates to a method for generating optimal pulses for magnetic resonance imaging using spatial modulation of magnetization (SPAMM), and more particularly, to a method for specifying the desired magnetization in certain frequency ranges and the desired smoothness for each range and then using the specified values to generate a pulse sequence which will optimally achieve the desired magnetization and smoothness for imaging.

2. Description of the Prior Art

Nuclear magnetic resonance (NMR) has many applications in chemistry and biology. Recent advances have made it possible to use NMR to image the human body. Because much of the body is water, which gives an excellent NMR signal, NMR can yield detailed images of the body and information about various disease processes.

The physical basis of NMR is that many nuclei, such as protons, have a magnetic spin. When an external field, $B_0$ (in the z axis direction), is applied to a system whose elements have a magnetic spin, the individual elements of the system precess around $B_0$ according to the Larmor frequency. The Larmor frequency, for typical values of the external field $B_0$ and for typical nuclei being investigated, is in the radio frequency (rf) range.

Generally, in NMR the system is perturbed by an alternating signal having a frequency $\omega$ at or near the Larmor frequency of the spins of interest, whose magnetic field ($B_1$) is normal to $B_0$. This field is called a pulse. Any spin with a Larmor frequency close to $\omega$ will interact with the applied field and rotate away from the z axis towards the xy plane. This interaction is called excitation of the spins. The precise axis of rotation and amount of rotation depend on the strength of the pulse, the duration of the pulse, and the difference between $\omega$ and $\omega_0$. If $B_1$ is very strong in relation to the off-resonance effects ($\omega - \omega_0$), then the rotation will be essentially around an axis in the xy plane and is called a hard pulse. Generally, the stronger the $B_1$ field, the broader range of frequencies that it will perturb. The longer the $B_1$ field is on, and the stronger the $B_1$ field is, the more the spins will be perturbed.

In a typical application, the spins of interest will have different $\omega_0$ values, either because they have a different environment, or because $B_0$ varies with location (a gradient). Furthermore, one needs to have different types of excitation of the spins depending on the application. The three most commonly needed types of excitation are described as a $\pi/2$ pulse, which rotates spins from the z axis to the xy plane, a $\pi$ pulse, which rotates spins from pointing in the positive z direction towards the negative z direction, and a refocusing pulse, which rotates spins of interest 180° about an axis in the xy plane, the axis being the same for all spins of interest. However, other types of excitation profiles can be needed, and one may need to apply a different type of excitation to different frequencies.

NMR imaging schemes depend on applying magnetic field gradients so that different nuclei at different locations experience different magnetic fields and, therefore, have different frequencies. Accordingly, the location of the nucleus determines its frequency. One then applies a pulse, which rotates, or excites, the nuclei, and therefore, the magnetic dipole moment. One tries to excite only nuclei which have frequencies corresponding to the slice of tissue which it is desired to image, and to excite those nuclei to the same degree.

Thus, it is necessary to design pulses which perturb a particular range of frequencies to the same extent but that do not perturb all other frequencies. This "ideal" pulse is physically unrealizable. However, it has been possible to generate pulses which will do this more or less perfectly. As a result, much work in the NMR imaging art has gone into generating pulses which will give very "sharp" slices, for the sharper the slice, the better the resolution of the image.

Previously, so-called "hard" radio frequency pulses have been used to give sharp slices for imaging. As known by those skilled in the art, a "hard" pulse is a constant amplitude rectangular radio frequency pulse in which the strength of the applied alternating field is sufficiently large that the pulse can be assumed to affect all frequencies of interest equally. Selective excitation is thus achieved by applying several pulses in a row and varying pulse widths and inter-pulse delay times. Different frequencies precess for different amounts during the delays between the pulses and thus respond differently to the pulse sequence. Many pulse sequences using hard pulses have been devised for different applications in NMR imaging, as described by P. J. Hore in an article entitled "Solvent Suppression in Fourier Transform Nuclear Magnetic Resonance", *Journal of Magnetic Resonance*, Vol. 55, pp. 283-300 (1983), for example, and by Brandes in U.S. Pat. No. 4,695,798.

However, hard pulse sequences have several major limitations. First the frequency response of hard pulses have "side lobes" or harmonics around the desired frequency range. The location of the side lobes depends on the delay between pulses. Second, if the frequency range of interest is large, as it is in NMR imaging, it may be difficult to create pulses that are strong enough to be considered "hard". Furthermore, the frequency response of hard pulse sequences currently in use is far from ideal.

Despite these limitations, hard pulses have been used effectively in the technique called spatial modulation of magnetization (SPAMM) described in the afore-mentioned parent application to image the heart wall. As described therein, SPAMM has been used to simultaneously create parallel sheets of altered magnetization that show up as stripes in subsequent images. Motion of the "tagged" tissue between the times of SPAMM application and imaging results in a corresponding displacement of the stripes, thereby permitting study of motions. Nevertheless, continuing efforts have been made to find pulse sequences with the desired frequency response and amplitude such that the best possible imaging stripes can be used.

For example, in an article entitled "Heart Wall Motion: Improved Method of Spatial Modulation of Magnetization for MR Imaging", *Radiology*, Vol. 172, August 1989, pp. 349-350, one of the present inventors implements SPAMM using a binomial series of radio frequency pulses which are separated by equal gradient pulses. In this sequence, during the radio frequency pulses all spins are on resonance, so the pulses are "hard", i.e., their effect on the spins is independent of the spatial location. The frequency encoding then occurs during the gradient pulses. The result is a sequence of hard pulses with free precession between the pulses. Because of the nice stripes generated when such binomial pulses were used, binomial pulses have been preferred for use with SPAMM. However, binomial pulse sequences provide limited flexibility because the relationships of the amplitudes of the binomial pulses are predefined and cannot be adjusted by the SPAMM user.

Others have also expended considerable effort in devising pulses which have better frequency characteristics. One of the best of these is the hyperbolic secant pulse described by M. S. Silver et al. in an article entitled "Highly Selective $\pi/2$ and $\pi$ Pulse Generation", *Journal of Magnetic Resonance*, Vol. 59, pp. 347-351 (1984). Unfortunately, even the response to this pulse does not have an ideal frequency response. Moreover, implementation of this pulse requires a spectrometer which can simultaneously modulate the amplitude and phase of the applied external field, which many spectrometers cannot do. Indeed, patents have issued on the instrumentation for the delivery of certain shaped pulses to the transmitter, such as the afore-mentioned patent to Brandes. Further continuing efforts to devise improved pulses are described by, for example, H. Yan and J. Gore in an article entitled "Improved Selective 180° Radio Frequency Pulses for Magnetization Inversion and Phase Reversal", *Journal of Magnetic Resonance*, Vol. 71, pp. 116-131 (1987). However, such other techniques of pulse generation for MR imaging do not provide selective pulses that have periodic excitations needed for creating the selective stripes of SPAMM, and, in any event, such pulse sequences are generally too long to be used with SPAMM. Better pulses for use with SPAMM are thus not suggested in the prior art.

In addition, the frequency response of a general system such as SPAMM has been studied by one of the present inventors in a sequence of papers: S. M. Eleff et al., "The Synthesis of Pulse Sequences Yielding Arbitrary Symmetric Magnetization Vectors" *Journal of Magnetic Resonance*, Vol. 12, pp 291-306 (1987); M. Shinnar and J. S. Leigh, "Frequency Response of Soft Pulses", *Journal of Magnetic Resonance*, Vol. 75, pp. 502-505 (1987); M. Shinnar and J. S. Leigh, "The Application of Spinors to Pulse Synthesis and Analysis", *Journal of Magnetic Resonance in Medicine*, Vol. 12, pp. 93-98 (1989); M. Shinnar et al., "The Use Of Finite Impulse Response Filters in Pulse Design", *Journal of Magnetic Resonance in Medicine*, Vol. 12, pp. 81-87 (1989); M. Shinnar et al., "The Synthesis of Pulse Sequences Yielding Arbitrary Magnetization Vectors", in *Journal of Magnetic Resonance in Medicine*, Vol. 12, pp. 74-80 (1989); and M. Shinnar et al., "The Synthesis of Soft Pulses With a Specified Frequency Response", *Journal of Magnetic Resonance in Medicine*, Vol. 12, pp. 88-92 (1989).

It was therein shown that the frequency response of a series of pulses can be written as a Fourier series, whose coefficients are nonlinear functions of the pulse amplitudes. A method was also described whereby, if one specified the desired $M_z$ magnetization as a Fourier series, one could generate a pulse sequence which will actually yield that magnetization. Furthermore, the way of specifying the desired M, magnetization as a Fourier series was realized to be identical to a solved problem in the design of finite impulse response filters. Using this technique, which has been described in detail in the afore-mentioned co-pending U.S. patent application Ser. No. 07/655,077, (now U.S. Pat. No. 5,153,155) one could specify the desired magnetization in certain frequency ranges, the desired smoothness for each range, and then generate a pulse sequence which would optimally achieve that desired magnetization.

The present inventors then joined forces to investigate whether the afore-mentioned pulse generation technique could be applied to the design of a pulse sequence or sequences which would be better than the afore-mentioned binomial sequence for SPAMM imaging. Since the stripes laid down for the SPAMM technique correspond to setting the z magnetization $M_z$, in certain frequency ranges, it seemed ideally suited for this pulse generation technique. As will be described herein, the present inventors have in fact found that improved images can be produced by using pulses generated in accordance with the afore-mentioned pulse generation technique in place of binomial pulses. The present invention is thus believed to meet the long-felt needs of the prior art.

SUMMARY OF THE INVENTION

The above-mentioned long-felt needs of the prior art have been met in accordance with the invention by providing methods of constructing pulse sequences to selectively excite frequency bands in NMR imaging using the techniques of SPAMM. The characteristics of the pulses are preferably predetermined by the SPAMM user and used by the pulse generating system of the invention to generate the pulses which will yield the desired imaging stripes. Such "optimal" pulses have been found to produce improved NMR images, for "optimal," as used herein, means that the pulse sequence will have the smallest possible error in approximating the desired pulse.

In accordance with the invention, a sequence of N hard pulses, $P_1$-$P_N$, is selected which satisfies the following conditions:

(1) Each pulse is assumed to be instantaneous, or sufficiently short that its duration can be ignored.

(2) The same amount of time, t, occurs between any two pulses. During this time the magnetization precesses around the z axis with frequency $\omega$.

(3) The total duration of the pulse sequence, Nt, is sufficiently short that relaxation can be ignored.

Then, if it is assumed that the z magnetization, as a function of frequency, started out at equilibrium, with $M_z(\omega)=1$, then the resultant z magnetization, assuming the system started in equilibrium, can be written as an $(N-1)$th order Fourier series in $\omega t$, where $\omega$ is the off-resonance frequency. Furthermore, if all pulses have the same phase, then the z magnetization is symmetric in frequency ($M_z(\omega)=M_z(-\omega)$), and can be written as an Nth order Fourier cosine series in $\omega t$. This Fourier series is not a Fourier transform of the hard pulse sequence, and the relationship between the pulses and the response is non-linear.

In preferred embodiments, the pulse generating method of the invention has the following characteristics:

(1) If one is given a Fourier series (in $\omega t$) description of the desired z magnetization of a hard pulse sequence of N pulses, then one can actually do an inversion of this nonlinear problem and determine a hard pulse sequence which will actually yield that desired response.

(2) Furthermore, if one is given a Fourier cosine series, one can generate a series of hard pulses around a fixed axis which gives the desired response.

(3) In general, one starts with a specification of the desired z magnetization not as a Fourier series in $\omega t$, but rather as having certain desired values over several frequency ranges. It was realized by one of the inventors that the techniques of digital filter design, specifically that of finite impulse response filters, not part of the art of NMR, could be applied to yield the desired Fourier series. Because the theory of digital filter design is quite advanced, one can generate Fourier series which optimally give the desired response. One thus can generate hard pulse sequences which have the optimal frequency response.

The method of the invention thus provides a technique of synthesizing a sequence of hard pulses for generating any desired realizable magnetization. The sequence of hard pulses is generated around a fixed axis which will generate any desired realizable magnetization which is symmetric in frequency. Preferably, the techniques of finite impulse response filters are used for specifying the desired magnetization. In accordance with a preferred embodiment of the invention, the generated hard pulse sequences are used in the pre-imaging SPAMM sequence to develop improved image slices of a patient's heart.

The novel advantages, features and objects of the present invention are specifically realized by a method of detecting motion of an image slice of a body portion of a patient using a magnetic resonance imaging device, comprising the steps of:

inputting parameters specifying the desired visual characteristics of the image slice;

synthesizing a radio frequency pulse sequence which, when applied to the body portion prior to imaging by the magnetic resonance imaging device, will cause the creation of an image slice having the desired visual characteristics;

applying to the body portion an external magnetic field so as to produce a resultant magnetization;

applying a pre-imaging sequence to the body portion so as to spatially modulate transverse and longitudinal components of the resultant magnetization to thereby produce a spatial modulation pattern, said pre-imaging sequence comprising the synthesized radio frequency pulse sequence and magnetic field gradient pulses;

applying an imaging sequence to the body portion to make visible said spatial modulation pattern of intensity; and detecting motion of the body portion during a time interval between application of the pre-imaging and imaging sequences by examining displacements of the spatial modulation pattern of intensity during the time interval.

BRIEF DESCRIPTION OF THE DRAWINGS

The above and other objects and advantages of the invention will become more apparent and more readily appreciated from the following detailed description of the presently preferred exemplary embodiment of the invention taken in conjunction with the accompanying drawings, of which:

FIG. 5 is a diagram illustrating the stripe differences between a seven pulse binomial sequence and a seven pulse optimal pulse sequence generated in accordance with the techniques of the invention.

DETAILED DESCRIPTION OF THE PRESENTLY PREFERRED EMBODIMENTS

Figure 1:
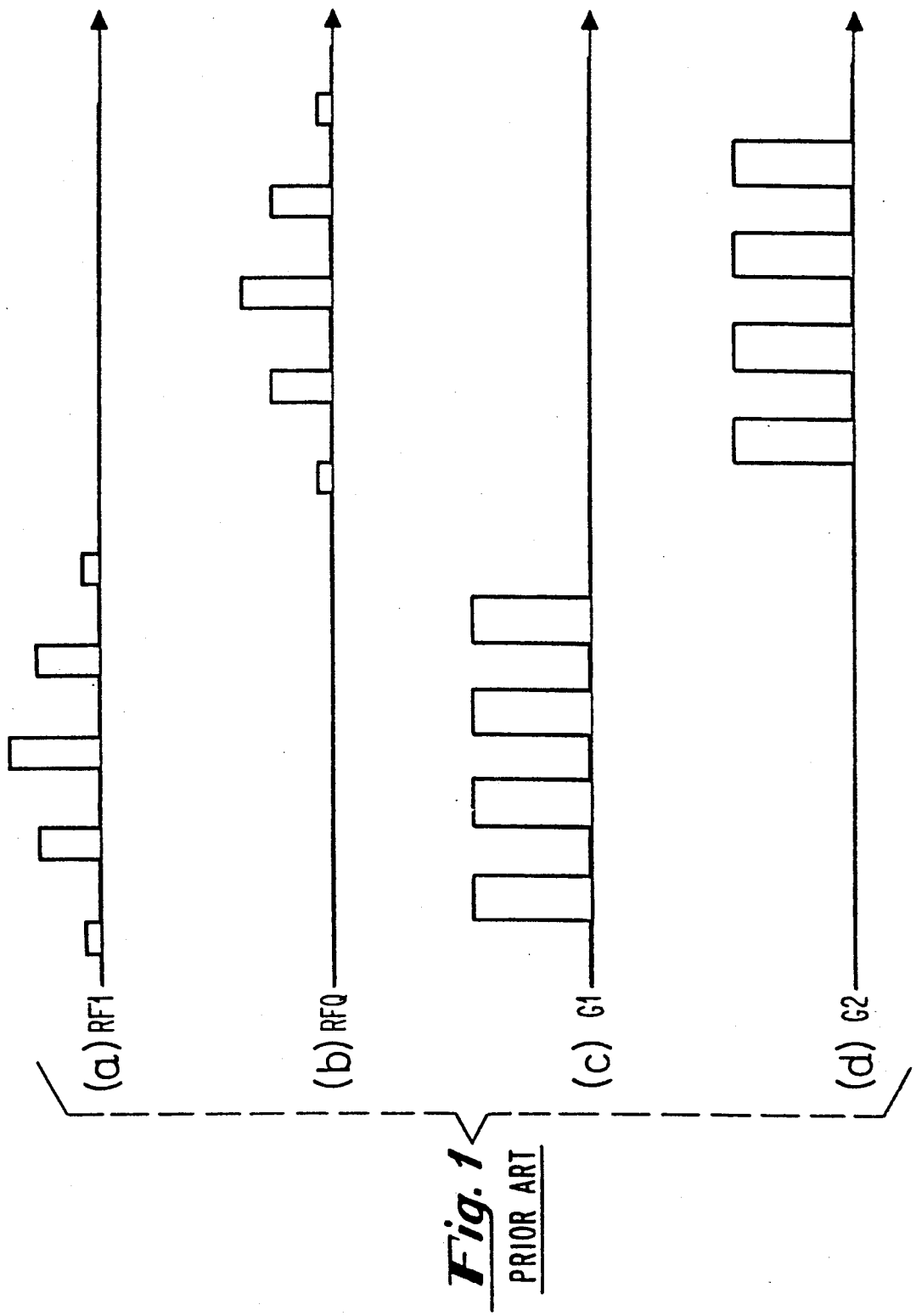
FIGS. 1 (a)-(d) are timing diagrams of SPAMM pulse sequence for a two-dimensional grid formation prior to imaging.

A SPAMM imaging technique in accordance with a presently preferred exemplary embodiment of the invention will be described below with reference to FIGS. 1-5. It will be appreciated by those of ordinary skill in the art that the description given herein with respect to those figures is for exemplary purposes only and is not intended in any way to limit the scope of the invention. All questions regarding the scope of the invention may be resolved by referring to the appended claims.

As described in the afore-mentioned parent application, the SPAMM technique may be used to image the heart by simply using a three pulse sequence consisting of two nonselective RF excitation pulses separated by a constant amplitude magnetic field gradient pulse. The sequence is then followed after a predetermined delay by a conventional imaging sequence. The first RF pulse produces transverse magnetization which is initially phase synchronized. The first RF pulse is followed by a gradient pulse which produces a regular variation of the phase of the excited spins along the direction of the gradient, with a wavelength inversely proportional to the integral of the gradient pulse amplitude. The second RF pulse turns some of the phase-modulated transverse magnetization back into longitudinal magnetization with a corresponding modulation. The modulation takes the form of a sinusoidal dependence of the longitudinal magnetization on position along the direction of the modulating gradient. The amplitude of the modulation depends on the strength of the RF pulses. For example, two 45° pulses will produce modulation between the extremes of saturation and full magnetization. However, longitudinal relaxation between the SPAMM and imaging sequences reduces the amplitude of the modulation. Accordingly, the pulse angles of the applied radio frequency pulses may sum to more than 90° to account for the longitudinal relaxation.

In the subsequent imaging sequence, the modulated longitudinal magnetization results in a corresponding intensity modulation in the final image, appearing as regularly spaced stripes perpendicular to the direction of the modulating gradient. Then, since the magnetization of any material moves as the material moves, any motion of the material between the time of the initial SPAMM sequence and the subsequent imaging sequence will be reflected in the corresponding displacement of the stripes in the final image.

SPAMM is analogous to some techniques used to produce selective excitation of chemical shifts in nuclear MR spectroscopy (e.g., for solvent suppression). In particular, the use of equal-strength nonselective RF pulses to produce selective saturation is roughly equivalent to the 1-1 case of binomial excitation pulses in spectroscopy as described by Hore in "Solvent Suppression in Fourier Transform Nuclear Magnetic Resonance", *Journal of Magnetic Resonance*, Vol. 55, 1983, pp. 283-300, with the modulating gradient pulse taking the place of the chemical shift.

However, as noted above, improved images have been obtained when more than two radio frequency pulses separated by gradients are used to generate the SPAMM stripes. For example, the selective excitation binomial pulse sequence has been shown by Axel et al. in the article entitled "Heart Wall Motion: Improved Method of Spatial Modulation of Magnetization for MR Imaging", Radiology, Vol. 172, 1989, pp. 349-350, to result in improved SPAMM heart wall images. In particular, Axel et al. therein disclose the use of a pulse sequence with a train of nonselective RF pulses, the relative amplitudes of which are distributed according to binomial coefficients such as 1-3-3-1 or 1-4-6-4-1, for example. The absolute amplitudes are adjusted for the total amplitude of modulation desired. Separating each of the RF pulses is a gradient pulse oriented perpendicularly to the desired stripe orientation and with a strength and duration dependent upon the desired stripe spacing. For the gradient amplitude G, the stripe spacing will be equal to the reciprocal of $\gamma \int G dt$, where $\gamma$ is the gyromagnetic ratio.

FIGS. 1 (a)-(d) illustrate an example of a binomial SPAMM pulse sequence for two-dimensional grid formation prior to imaging, with RF pulse amplitudes distributed as 1-4-6-4-1. Preferably, there is a phase shift of 90° from RFI to RFQ to avoid artifacts, while gradients G1 and G2 are orthogonal so as to produce orthogonal sets of stripes. Gradient pulses used for modulation have an amplitude and duration such that the area under the pulse shape is inversely proportional to the desired stripe spacing. A brief delay between gradient pulses and RF pulses allows the gradients to settle. Also, to avoid perturbing the stripe pattern with the effects of local field variations or regional chemical shift differences (e.g., fat vs. water), the time interval between RF pulses should be kept short.

Thus, a two-dimensional array of stripes may be used to form a tagging grid by following the initial SPAMM sequence with a second one, with the gradient oriented in an appropriate new direction. To avoid producing artifacts from stimulated echo formation, the phase of the RF pulse is preferably shifted by at least 90° between the two sequences. For effective composite flip angles other than 90°, the degree of saturation in the stripe intersections may differ from that in the stripes.

Figure 2:
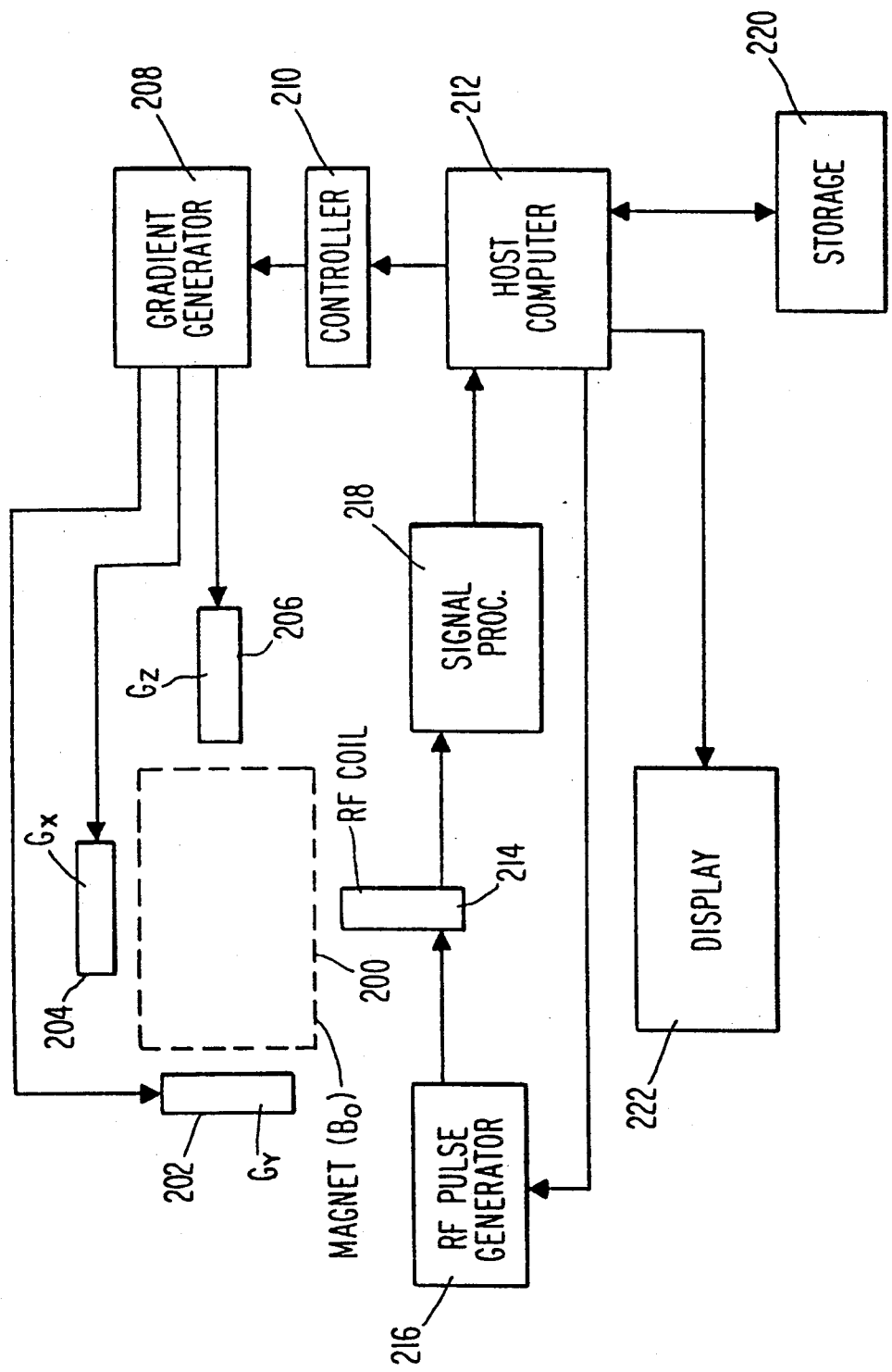
FIG. 2 is a schematic diagram of a magnetic resonance imaging system in accordance with an embodiment of the invention whereby optimal rf pulses are calculated for application during SPAMM imaging.

The SPAMM sequencing for forming a two-dimensional array of stripes which forms a tagging grid as described above may be implemented on a conventional MR imaging system such as the Signa 1.5-T MR imaging system from GE Medical Systems. A simplified schematic diagram of such an MR imaging system is shown in FIG. 2. As shown, the MR imaging system has a main magnet 200 which provides a steady magnetic field $B_0$ which polarizes the nuclei of the protons of the specimen or subject for which an image is desired. Generally, within magnet 200 there is a space in which the specimen or individual to be examined is placed.

The MR imaging system of FIG. 2 also includes a set of three orthogonal direct current coils 202, 204, and 206 for producing spatial linear field gradients $G_x$, $G_y$, and $G_z$. These coils are driven by gradient generator 208, which in turn is controlled by a controller 210 which communicates with a host computer 212. Host computer 212 generates the pulse sequences and controls application of the field gradients. Host computer 212 thus implements the pulse generation process of the invention to be described in more detail below.

The MR imaging system of FIG. 2 also includes a radio frequency (RF) coil 214 which generates a radio frequency field in the specimen being analyzed and also senses a free induction decay or spin echo signal which is generated after termination of the radio frequency pulse.

RF pulse generator 216 excites RF coil 214 in response to host computer 212 to apply the desired pulse sequences. The signal processor 218 receives the small microvoltage level spin echo signals, converts them into digital form and inputs them into host computer 212 for formation of an image (typically using Fourier transform techniques). The resulting images are then manipulated for display and stored in storage device 220 for later retrieval or immediately displayed on display device 222.

Hence, the apparatus of FIG. 2 may be used to implement the pre-imaging SPAMM sequence described in U.S. Pat. No. 5,054,489 and to implement the imaging sequence for detecting heart wall movement. In a preferred embodiment, SPAMM pulses for heart imaging may be integrated into a conventional cardiac-synchronized imaging sequence, where the SPAMM sequence can be started with a trigger pulse derived from the electrocardiogram. A two-dimensional grid of stripes can then be produced with two 1-4-6-4-1 RF pulse sequences, for example, along with gradient pulses. Although binomial sequences produce excellent SPAMM stripes, the present inventors have now found that "optimal" pulses may be obtained by allowing the SPAMM user to specify the desired stripe parameters and then generating the pulse sequence which will produce the desired stripes. Accordingly, this pulse generation technique will now be described in detail with respect to FIGS. 3-5.

Figure 3:
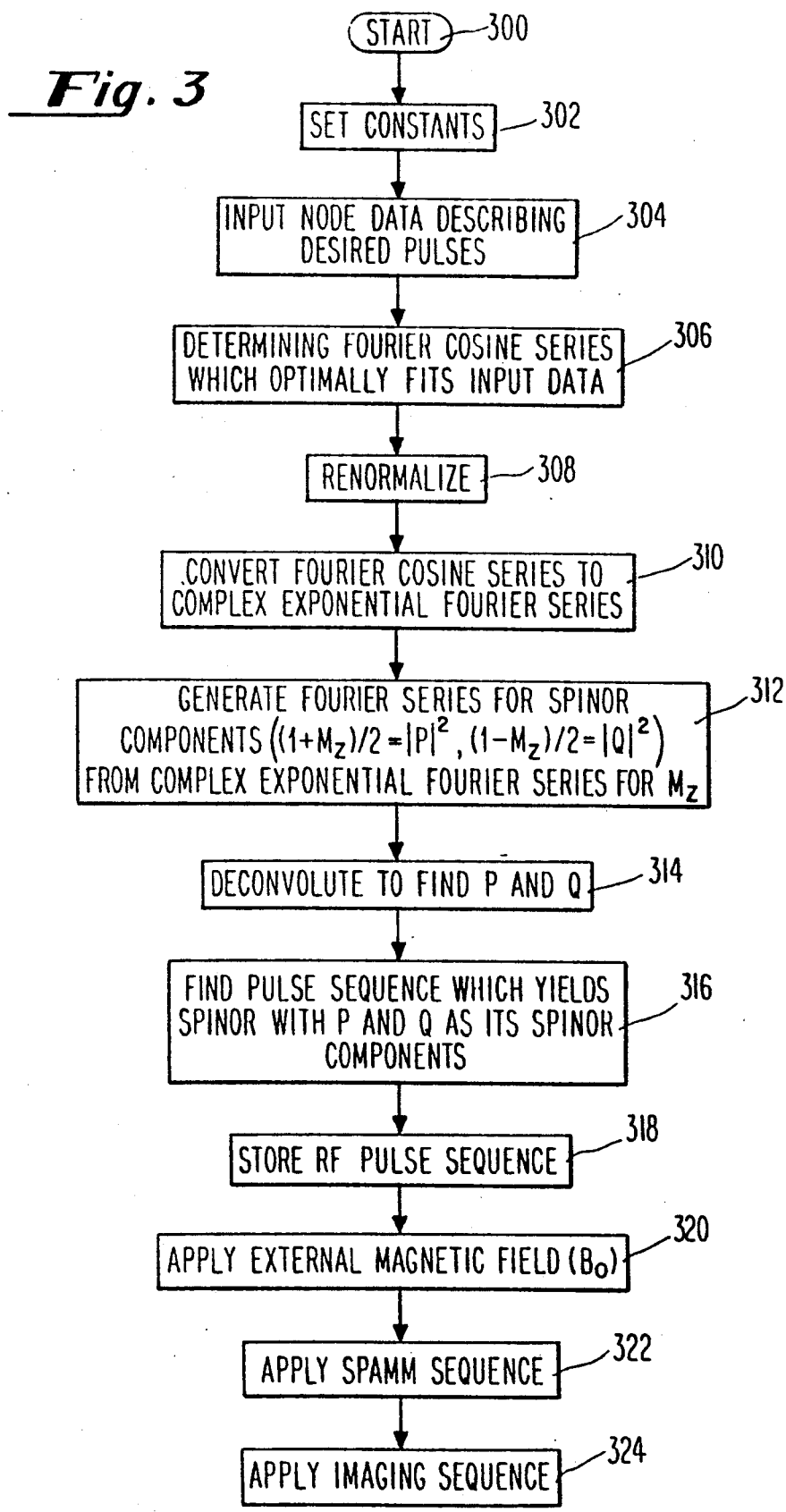
FIG. 3 is a flow chart illustrating a preferred embodiment of the SPAMM imaging technique of the invention.

FIG. 3 is a flow chart illustrating a preferred embodiment of the SPAMM imaging technique of the invention. As shown, the pulse generating system of the invention may be implemented as a process which runs on host computer 212 (FIG. 2). A preferred embodiment of such a process is given in microfiche Appendix A and should be referred to in conjunction with the description of FIG. 3. However, before describing the pulse synthesis algorithm with respect to FIG. 3, it will first be explained how the units of the pulse synthesis algorithm correspond to the units of SPAMM imaging.

In particular, the algorithm to synthesize the pulse sequence specifies the desired magnetization in terms of frequency units and the duration of the portion of the pulse sequence during which the spins are freely processing. In MR imaging, on the other hand, one is interested in the magnetization at a desired location. The relationship between frequency and location is adjustable, depending on the gradient strength. However, one can easily convert the units so that one can see the relationship. In other words, since the magnetization response of such a hard pulse sequence is periodic, with a period $1/t$, where t is the time the spins freely precess between any two pulses (not the total pulse sequence duration), this periodicity may be used to lay down a series of stripes.

The pulse synthesis algorithm of the invention allows one to specify a series of frequency bands, with the desired magnetization and desired smoothness being specified in each band. The specification of the frequency bands is most naturally done in terms of the periodic frequency, $1/t$. For example, one may choose to have the z magnetizations of spins with frequencies between 0 and $0.1/t$ be 0 and those between $0.2/t$ and $0.8/t$ be 1. However, because the pulses are all around the same axis, one is guaranteed symmetry around zero frequency and therefore around $0.5/t$. That is, $Mz(\omega)=Mz(-\omega)$, where $\omega$ is the frequency.

Thus, to convert the above to imaging, it becomes apparent that this approach automatically specifies the stripe thickness in terms of the interstripe distance. The interstripe distance is set by determining how long the gradient will be on between pulses, which determines the interstripe frequency difference, and then the gradient strength, which determines the conversion of frequency to distance. Accordingly, the interstripe distance is ultimately determined by the product of the average gradient strength (Hz/cm) and the time the gradient is on between pulses. Increasing the gradient strength or the time will decrease the interstripe distance.

One skilled in the art will appreciate that the above discussion assumes the gradient is off during the application of the radio frequency pulses. This guarantees that, subject to the uniformity of the radio frequency field of the coil, the pulses are sufficiently hard to excite all spins equally. However, one may want to leave the gradient on during the pulses. This requires that enough radio frequency power be used that the pulses are sufficiently "hard" to equally excite all frequencies of interest. For example, if the radio frequency pulses are very narrow, they must have higher amplitudes for a given gradient strength. Otherwise the procedure is unchanged from the approach where the gradient is off when the radio frequency pulses are applied.

As shown in FIG. 3, MR imaging starts at step 300 in accordance with the invention by setting the value of internal program constants (Appendix A lines 1–14) (step 302) and then requesting the user to input the desired pulse parameter data (Appendix A lines 15–57) (step 304). As noted above, this data generally includes the number of desired RF pulses to be used in the pre-imaging sequence, the desired stripe thickness and the size of the transition zone between the striped and non-striped regions. The Fourier cosine series which optimally fits the input specifications is then calculated (Appendix lines 58–108) (step 306) using an algorithm similar to that previously disclosed by T. W. Parks et al. in an article entitled "A Program for the Design of Linear Phase Finite Impulse Response Filters," *IEEE Transactions on Audio and Electroacoustics*, Vol. AU-20, pp. 195–199 (1972). The mathematical theory behind application of this technique for pulse generation can be found in the afore-mentioned related U.S. patent application Ser. No. 07/655,077 and is specifically set forth below. The resulting Fourier cosine series can then be renormalized (Appendix A lines 109–130) (step 308) so that the absolute value of the Fourier cosine series is always less than one.

Once the Fourier cosine series is renormalized, it is then converted to a complex exponential Fourier series (Appendix A lines 135–142) (step 310). The resulting data is then formatted so that it can used by a pulse generating routine, or the data is fed directly into a pulse generating subroutine for synthesizing an optimal pulse sequence (Appendix A lines 131–143 and subroutine "PULS"). A Fourier series for the spinor components $((1+M_z)2=|P|^2$ and $(1-M_z)2=|Q|^2$ is then calculated from the Fourier for $M_z$ (Appendix A subroutine "PULS" lines 16–38) (step 312). P and Q are then calculated using cepstral deconvolution (Appendix A Subroutine "PULS" lines 39–53) (step 314). For each set of P and Q, the pulse sequence which yields the spinor with P and Q as its spinor components is then calculated (Appendix A subroutine "PULS" lines 54–88) (step 316). This latter step is generally accomplished by attempting to reduce the Fourier series order one order at a time as described in detail in the afore-mentioned related U.S. patent application Ser. No. 07/655,077 and then choosing which values of P and Q to use. The result will be the optimal RF pulse sequence which can then be output to a file or other media for storage (step 318).

Once the optimal pulse sequence has been generated, the pre-imaging and imaging sequences may be started. This is accomplished by applying the external magnetic field $B_0$ to the specimen (step 320) and feeding the optimal pulse sequence to the RF coil for application with the gradient pulses as the SPAMM pre-imaging sequence (step 322). The imaging sequence is then applied to detect the stripe displacements (step 324).

Further details regarding the optimal pulse generating technique of the invention can be found upon closer inspection of the Fortran source code listing of Appendix A.

The disclosed pulse generating technique of the present invention thus obtains the $B_1$ field which will actually yield a desired excitation profile. If the desired excitation profile is physically realizable, the method of the invention will invert the nonlinear relationship between the input $B_1$ field and excitation to obtain the desired $B_1$ field. Moreover, if one starts out with a desired excitation profile which is not physically realizable, the method of the invention gives a procedure for a physically realizable profile which is closest to the desired profile, and then finds a $B_1$ which will yield the desired profile.

The following represents the mathematical formulation of a pulse sequence which will yield arbitrary symmetric magnetization vectors for use as RF pulses in SPAMM imaging in accordance with the invention.

As described by the one of the present inventors in an article entitled "The Synthesis of Pulse Sequences Yielding Arbitrary Symmetric Magnetization Vectors", in *Journal of Magnetic Resonance*, Vol. 72, pp. 298-306, the first step of the pulse generation method of the invention is to start with a physically realizable z magnetization which may be achieved by a hard pulse sequence and to determine a hard pulse sequence which will actually yield that z magnetization. In particular, an N hard pulse sequence to be applied around the x axis within a total duration of T has a magnetization response $M_z$ which can be written (as a function of frequency) as a Fourier cosine series:

$$M_z(\omega) = \sum_{j=0}^{N-1} a_j \cos(j\omega T/(N-1)) \qquad \text{Equation (1)}$$

with $|M_z(\omega)|$ always $<1$.

If a specification of a desired $M_z(\omega)$ is given, then we know, since magnetization is preserved by the pulses, that $M^2_x(\omega) + M^2_y(\omega) + M^2_z(\omega) = 1$. The first step of the invention is thus to find an appropriate solution of $M_x$ and $M_y$ which will satisfy this equation. For this purpose, we write $M_{xy}(\omega) = M_y(\omega) - iM_x(\omega)$. The above condition then becomes $|M_{xy}(\omega)|^2 + M^2_z(\omega) = 1$.

This reduces to a phase retrieval or deconvolution problem, well studied in signal analysis, although generally not familiar to those skilled in the NMR art. There are a number of approaches to solving this problem. For example, one can convert $M_z(\omega)$ to a complex polynomial in $s = exp(i\omega T/(N-1))$ and then solve for the roots of the polynomial $1 - M^2_z(\omega)$, or equivalently for the two polynomials $(1-M_z(\omega))$, $1+M_z(\omega))$. One then groups the roots of the polynomials by means of symmetry considerations and chooses half of them. There are also techniques such as cepstral deconvolution which allow for the solution of $M_{xy}(\omega)$ as an $(N-1)$ degree polynomial in $s = exp(i\omega T/(N-1))$. This is a representation of $M_{xy}(\omega)$ as an $N-1$th degree complex Fourier series. One can guarantee that since the polynomial for $M_z$ had real coefficients, the polynomial for $M_{xy}$ will also have real coefficients. The Fourier coefficients may be generated by viewing $M_z$ as a function of $\Omega$, where $\Omega = \omega T/N-1)$, using a digital fast Fourier transform and looking at the cosine coefficients.

The following are the details of one possible approach to the resulting deconvolution problem:

Letting $\Omega = \omega T/(N-1)$, we first express $|M_{xy}(\Omega)|^2$ as a polynomial in cos $(\Omega)$. Namely, using Tschebyscheff polynomials, one can write $\cos(n\Omega) = T_n(\cos(\Omega))$ as a polynomial in cos $(\Omega)$. Thus, one can write:

$$M_z(\Omega) = \sum_{j=0}^{N} b_j (\cos(\Omega))^j = Q(\cos(\Omega)). \qquad \text{Equation (2)}$$

We now assume that there is no loss of magnetization during the entire pulse sequence. That is, $N\tau << T_z$ for N pulses with a constant time spacing $\tau$. Then:

$$|M_z(\Omega)|^2 + |M_{xy}(\Omega)|^2 = |M_O|^2, \qquad \text{Equation (3)}$$

where $M_O$ is a constant which may be normalized to 1. We can therefore write $M_{xy}(\Omega) = sqrt(1-|M_z(\Omega)|^2)e^{i\phi}$, where $\phi$ is the phase relationship we are trying to construct. We shall use this relationship to write $M_{xy}(\Omega)$ as a complex Fourier series.

Since $M_z(\Omega)$ is real, $|M_z(\Omega)|^2 = (M_z(\Omega))^2$. We can therefore write, for $u = \cos(\Omega)$:

$$P(u) = 1 - Q(u)^2 = 1 - |M_z(\Omega)|^2 = \sum_{j=0}^{2N} b_j u^j = |M_{xy}(\Omega)|^2 \qquad \text{Equation (4)}$$

Viewing $P(u)$ as a polynomial in u, we now factor $P(u)$ to solve for its roots:

$$P(u) = b_{2N} \prod_{j=1}^{2N} (u - u_j) \qquad \text{Equation (5)}$$

We now define $s = e^{i\Omega}$, where $u = (s+s^{-1})/2$. We can therefore define rational function $R(s)$ and give its factorization as follows:

$$R(s) = P((s + s^{-1})/2) = \qquad \text{Equation (6)}$$

$$b_{2N} 2^{-2N} s^{-2N} \prod_{j=1}^{4N} (s - s_j) = 1 - |M_z(\Omega)|^2$$

Next, we group the roots into conjugate pairs noting that $s_j$ is a root of $R(s)$ if and only if $(s_j+s_j^{-1})/2 = u_k$, for some k. Thus, if $s_j$ is a root, $s_j^{-1}$ is a root. Furthermore, because $P(u)$ has real coefficients, if $u_j^*$ is a root, $u_j^*$ is a root (with * denoting complex conjugate). So if $s_j$ is a root, $S_j^*$ is a root as well. We also note that $|s|=1$ occurs only when u is real, and $|u| \leq 1$. Since $P(u) = 1 - M_z(\Omega)|^2 \geq 0$ for $u = \cos(\omega\tau)$, thus any root $u_j$ with $u_j$ real and $|u_j| < 1$ must occur with even multiplicity. Therefore, roots $s_j$ can be grouped as follows:

1) $r_j$ real, $|r_j| = 1$ can be grouped into $r_j$, $r_j^{-1}$, $j=1,L$.
2) $f_j$ complex, $|f_j| = 1$. Then $f_j$, $f_j^{-1}$, $f_j^{-1*}$ are roots, $j=1,M$.
3) $g_j$ real, $|g_j| = 1$. Every $g_j$ occurs with even multiplicity, $2*K_j$, $j=1,K$.
4) $h_j$ complex, $|h_j| = 1$. Again, $h_j$ occurs with even multiplicity $2*H_j$. Furthermore if $h_j$ is a root so is $h_j^* = h_j^{-1}$. Thus, we can group roots into $h_j$, $h_j^{-1}$, with multiplicity $2*H_j$, $j=1,H$.

We next need to select a phase function for $M_{xy}(\Omega)$. Accordingly, for each set of roots, we choose a representative. Thus, for each set of real roots $a_j$ we choose either $r_j$ of $r_j^{-1}$. For each set of complex roots, $f_j$, we choose a conjugate pair, either $f_j$, $f_j^*$, of $f_j^{-1}$, $f_j^{-1*}$. This gives us $2^{(L+M)}$ choices. Each choice gives us a different phase function for $M_{xy}(\Omega)$.

Using our choices in the previous step, we now define the following rational function to define $M_{xy}(\Omega)$:

$$G(s) = As^{-N} \left( \prod_{j=1,}^{L} (s - r_j) \prod_{j=1}^{M} (s - f_j)(s - f_j^*) \right) \times \qquad \text{Equation (7)}$$

$$\left( \prod_{j=1}^{K} (s - g_j)^{K_j} \prod_{j=1}^{H} (s - h_j)(s - h_j^{-1}) \right).$$

with

-continued

Equation (8)
$$A^2 = b_2 N 2^{-2N} / \left( \prod_{j=1}^{L} (r_j) \prod_{j=1}^{H} (f_j f_j^*) \prod_{j=1}^{K} (h_j) K_j \right)$$

It can be shown that A is real, so G(s) has real coefficients. We now claim that $R(s) = G(s)G(s^{-1})$, which can be easily verified by multiplying through. We define:

$$M_{xy}(\Omega) = G(s), \text{ for } s = e^{i\Omega}. \qquad \text{Equation (9)}$$

We claim that this $M_{xy}(\Omega)$ satisfies Equation (3), and since G(s) has real coefficients, $G(s^*) = G(s)^*$. Therefore, for $|s| = 1$,

$$|M_{xy}(\Omega)|^2 = G(s)G(s)^* = G(s)G(s^*) = G(s)G(s^{-1}) = R(s) = 1 - |M_z(\Omega)|^2. \qquad \text{Equation (10)}$$

In defininq G, we could choose either A or −A. Thus, there are $2^{L+M+1}$ choices in defining G. $M_z(\Omega)$ and $M_{xy}(\Omega)$ are thus expressed as finite Fourier series and the xy magnetization after the jth pulse is defined, $M_{xy}(\Omega)_j$, for $j=0$ and $j=N$. The next step is to find a pulse sequence which will yield that Fourier series.

One can express the effect of a pulse of f degrees around the x axis on the magnetization $(M_x, M_y, M_z)$ as a matrix P(f). The effect of free precession for a time $(T/(N-1))$ at frequency $\omega$ can also be written as a matrix $R(\omega)$. Thus, the effect on the magnetization of a free precession and a pulse is $(P(f) \cdot R)$, viewed as a matrix product.

We then apply $R^{-1}P^{-1}(f)$ to the given $(M_x, M_y, M_z)$. The resultant expression is still a Fourier series. We then solve for the f that will yield a Fourier series of order $N-2$. We then repeat the procedure until we reduce the magnetization to a constant $M_z$, and constant $M_{xy}$. We then apply a $P^{-1}(f)$ which will yield $M_z = 1$ and $M_{xy} = 0$. The resultant series of pulses will yield, when applied in reverse to a system with $M_z = 1$ and $M_{xy} = 0$, a system with magnetization equal to the desired one.

That this part of the invention could be done was announced in an abstract published by one of the inventors entitled "An Exact Synthesis Procedure For Frequency Selective Pulses", in 5th *Proceedings of the Magnetic Resonance in Medicine*, pp. 1452-1453, August, 1986. However, the details of how to obtain the pulse sequence were not given in that abstract. The technique for obtaining the pulse sequence first appeared in the aforementioned articled entitled "The Synthesis of Pulse Sequences Yielding Arbitrary Symmetric Magnetization Vectors" by one of the present inventors. The relevant portions of the calculations set forth in that paper for obtaining the hard pulse sequence will be reproduced here.

Having generated $M_{xy}(\Omega)$, we have defined the xy magnetization after the jth pulse, $M_{xy}(\Omega)_j$, for $j=0$ and $j=N$. We will develop a simple recursion relationship to allow the calculation of $M_{xy}(\Omega)_{j-1}$ from $M_{xy}(\Omega)_j$. That is, we will work backwards. In addition, a formula for calculating the jth pulse from $M_{xy}(\Omega)_j$ will be derived. Having accomplished these two substeps, the pulse sequence will be completely defined.

The following matrix definitions will be used for the derivations.
$M = [m_x, m_y, m_z]^T$, with $T$ denoting the transpose, and $$R = \begin{bmatrix} \cos\Omega & -\sin\Omega & 0 \\ \sin\Omega & \cos\Omega & 0 \\ 0 & 0 & 1 \end{bmatrix}$$

$$P = \begin{bmatrix} 1 & 0 & 0 \\ 0 & \cos\phi & -\sin\phi \\ 0 & \sin\phi & \cos\phi \end{bmatrix}$$

where M is the magnetization vector, P·M simulates a pulse and flips the spins around the x axis, and R·M rotates the spins in the xy plane. The sequence we will use applies a rotation and then a pulse. In matrix notation this is (P·R). The initial rotation with $M=[0,0,1]$ has no effect, and the final pulse is not accompanied by a rotation since all spins are pre-rotated (that is, the operation is (P·R) not (R·P)).

Spins are neither created nor destroyed during the application of the pulse sequence. Removing the effects of (P·R) from $M_p$ will yield $M_{p-1}$.

This is accomplished by multiplying by (P·R) inverse, $(P \cdot R)^{-1}$:

$$(P \cdot R)_p^{-1} = \begin{bmatrix} \cos\Omega & \cos\phi_p\sin\Omega & \sin\phi_p\sin\Omega \\ -\sin\Omega & \cos\phi_p\cos\Omega & \sin\phi_p\cos\Omega \\ 0 & -\sin\phi_p & \cos\phi_p \end{bmatrix}$$

Hence, $$M_{p-1} = \{(P \cdot R)^{-1}\}M_p = \{(P \cdot R)_p^{-1}\}\{[m_x, m_y, m_z]_p\} \qquad \text{Equation (11)}$$

The following derivations hinge on the fact that the only perturbations on the spin system are repeated applications of precession around the z-axis followed by a pulse around the x-axis. Rotation around the y-axis is not covered by the resulting formulae. Noting that $M_{xy} = -M_y + iM_x$ and substituting into Equation (11) yields:

$[M_z]_{p-1} = -\sin\phi_p[M_y]_p + \cos\phi_p[M_z]_p$ or
$[M_z]_{p-1} = (i)\sin\phi_p[M_{xy} + M_{xy}^*]_p + [M_z]_p \cos\phi_p$ Equation (12)

Similarly,

Equation (13)
$[M_{xy}]_{p-1} = [-M_y + iM_x]_{p-1} = [M_x\sin\Omega - M_y\cos\phi\cos\Omega -$ $M_z\sin\phi\cos\Omega + iM_x\cos\Omega + iM_y\cos\phi\sin\Omega + iM_z\sin\Omega\sin\Omega]_p =$ $[M_x]_p(i\cos\Omega + \sin\Omega) + [M_y]_p\cos\phi(-\cos\Omega + i\sin\Omega) +$ $[M_z]_p\sin\phi(-\cos\Omega + i\sin\Omega) = [M_x]_p(ie^{-i\Omega}) + (M_y)_p\cos\phi(-e^{-i\Omega}) +$ $[M_z]_p\sin\phi(-e^{i\Omega}) = [M_z]_p\sin\phi(-e^{-i\Omega}) = [M_z]_p\sin\phi(-e^{-i\Omega}) +$ $(1/2)e^{-i\Omega}\{([M_{xy}]_p + [M_{xy}^*]_p)\cos\phi + ([M_{xy}]_p - [M_{xy}^*]_p)\}.$ Thus, $[M_{xy}]_{p-1} = (1/2)(1 + \cos\phi_p)e^{-i\Omega}[M_{xy}]_p -$
$(1/2)(1 - \cos\phi_p)e^{-i\Omega}[M_{xy}^*]_p - \sin(\phi_p)e^{-i\Omega}[M_z]_p.$ Numerically, we have $[M_z]_N$ and $[M_{xy}]_N$ as Fourier coefficients. We therefore need to convert Equations (12) and (13) into equivalent form. This can be accomplished by equating terms of equal order. Let $a_r$ represent the rth Fourier coefficient for $M_z$ which corresponds to $e^{ir\Omega}$ and let $f_r$ correspond to the rth Fourier coefficient for $M_{xy}$. We note that since:

$$M_z(\Omega) = M_z(-\Omega) \text{ and } a_r = a_{-r}, \text{ that: } [a_r]_{p-1} = (\tfrac{1}{2})\sin \phi_p([f_r]_p + [f_{-r}]_p) + \cos \phi_p[a_r]_p \quad \text{Equation (14)}$$

and $$[f_r]_{p-1} = (\tfrac{1}{2})(1+\cos \phi_p)[f_{r+1}]_p - (\tfrac{1}{2})(1-\cos \phi_p)[f_{-(r+1)}]_p - \sin \phi_p[a_{r+1}]_p. \quad \text{Equation (15)}$$

For a sequence of N pulses, the Fourier coefficients range from $-(N-1)$ to $(N-1)$. That is, $[f_r]_p = [a_r]_p = 0$ for $|r| \geq p$. We now set $r = (p-1)$ in Equation (14) and get $[a_{p-1}]_{p-1} = 0 = \sin \phi_p([f_{p-1}]_p + [f_{-(p-1)}]_p) + \cos \phi_p[a_{p-1}]_p$. Rearranging yields:

$$\tan \phi_p = -[a_{p-1}]_p/([f_{p-1}]_p + [f_{-(p-1)}]_p). \quad \text{Equation (16)}$$

Setting $r = -p$ in Equation (15) yields $[f_{-p}]_{p-1} = 0 = (\tfrac{1}{2})(1+\cos \phi_p)[f_{-p+1}]_p - (\tfrac{1}{2})(1-\cos \phi_p)[f_{-(p+1)}]_p - \sin \phi_p[a_{-p+1}]_p$. Since we know that $a_r = a_{-r}$, it can be shown that $[f_{p-1}]_p$ and $[f_{1-p}]_p$ are of opposite sign. Therefore, we can define:

$$\cos \phi_p = ([f_{p-1}]_p + [f_{-(p-1)}]_p)/([f_{p-1}]_p - [f_{-(p-1)}]_p) \quad \text{Equation (17)}$$

Substituting into Equation (16) we obtain the last of the recursion values:

$$\sin \phi_p = -[a_{p-1}]_p/([f_{p-1}]_p - [f_{-(p-1)}]_p). \quad \text{Equation (18)}$$

The synthesis of the pulse sequence is completed by using the $M_z$ Fourier coefficients, $[a_r]_N$, where $M_z(\Omega)$ is generated using a digital fast Fourier transform and from the $M_{xy}$ Fourier coefficients, and by using $[f_r]_N$ from the generation of $M_{xy}(\Omega)$ to calculate the leading flip angles $\cos \phi_n$ and $\sin \phi_n$ from Equations (17) and (18) with $p = N$. We then decrease p, the current pulse, which started at N, and calculate $[a]_p$, $[f]_p$, $\cos \phi_p$, and $\sin \phi_p$ for $p = N-1, \ldots, 2$. We can then calculate the first pulse by calculating the net angle required at $M_z(\Omega = 0)$ and the sum of all angles calculated in the previous two steps, i.e., if $M_z(\Omega = 0) = 0$, and the sum of the $\phi_p$'s for $p = 2, N$ was $\pi/3$, then the first pulse angle should be $-\pi/3$.

The above procedure can also be generalized to cases where $M_z$ was specified as a complex Fourier series. In such a case, the above procedure could be repeated. However, the phase retrieval problem is more complicated, and the coefficients of $M_{xy}$ will in general be complex. One may then repeat the above inversion procedure. However, then a pulse is specified not only by the number of degrees it rotates, but also by the phase of the pulse in the xy plane. A solution of the inverse problem was published by one of the present inventors in an article entitled "The Synthesis of Pulse Sequences Yielding Arbitrary Magnetization Vectors", *Journal of Magnetic Resonance in Medicine*, Vol. 12, pp 74–80 (1989), the contents of which are hereby incorporated by reference. Hence, the present invention may be easily extended to cases where the magnetization does not correspond to a fixed axis.

As noted above with respect to FIG. 3, the preferred embodiment of the pulse generator of the invention uses spinors in the optimal pulse determination. Spinors allow the rotation operator to be monitored, as described, for example, by L. D. Landau and E. M. Lifschitz in *Quantum Mechanics: Non-Relativistic Theory*, pp. 188–196, Pergamon Press, London, 1965, and by I. V. Aleksandrov in *The Theory of Nuclear Magnetic Resonance*, pp. 169–181, Academic Press, NY 1966, and are thus presently preferred. Spinors are useful when one wishes to specify not only the final z-magnetization, but also the rotation operator. For example, in imaging, one may wish to specify a pulse that rotates 180° about an axis in the xy plane, like an inversion pulse. Furthermore, one may wish to specify that all frequencies get rotated about the same axis. This type of pulse is a refocusing pulse. Therefore, looking at the pulse as an operator on the magnetization, one would like to specify the components of this operator. The present invention may be extended to this area as well using spinors. Such an extension using spinors has been described by one of the present inventors in an abstract in August 1988 and later in more detail in a paper entitled "The Application of Spinors to Pulse Synthesis and Analysis", *Journal of Magnetic Resonance in Medicine*, Vol. 12, pp. 93–98 (1989), the contents of which are hereby incorporated by reference.

The present invention has been described as a system which generates "optimal" RF pulses for use in generating SPAMM images. As noted above, the RF pulses applied to the RF coil if they are the RF pulses requested by the operator of the MR imaging device. Accordingly, some comments regarding the features of such pulses will be given here to help the operator determine what pulse features may be desirable.

1) Interstripe distance. One wants to have stripes that are sufficiently close so that one can track many different points. However, the stripes should be sufficiently far apart so they can be easily separated. The major import of this interstripe distance is that if one can give narrower stripes, one might be able to space them closer together.

2) Narrowness. The stripes laid down by the pulses should be narrow. However, they should be at least a pixel wide, maybe even wider so that they can be easily seen on the image. Since the pixel size may change with the imaging technique and the gradient strength applied, the optimal stripe thickness may vary from specimen to specimen. This condition is easily adjustable by using the pulse generating algorithm of the invention to specify the line width.

3) Sharpness. The transition from stripe to normal image should be as sharp as possible, so as little of the picture is disturbed as is necessary. This is again a parameter which can be specified with the pulse generating algorithm of the invention. This parameter can be specified as a fraction of the interstripe distance. Also, the observed narrowness of the stripes is actually a function of the sharpness. That is, the stripe is observable not only on the band where it is specified, but also over part of the transition zone, where the z magnetization is between the specified value and 1. As long as the z magnetization is sufficiently small, it will be observed as a dark line. Thus, for the sharpest lines, one can specify an extremely narrow line and use the transition zone to make it sufficiently wide so as to be visible.

Figure 4:
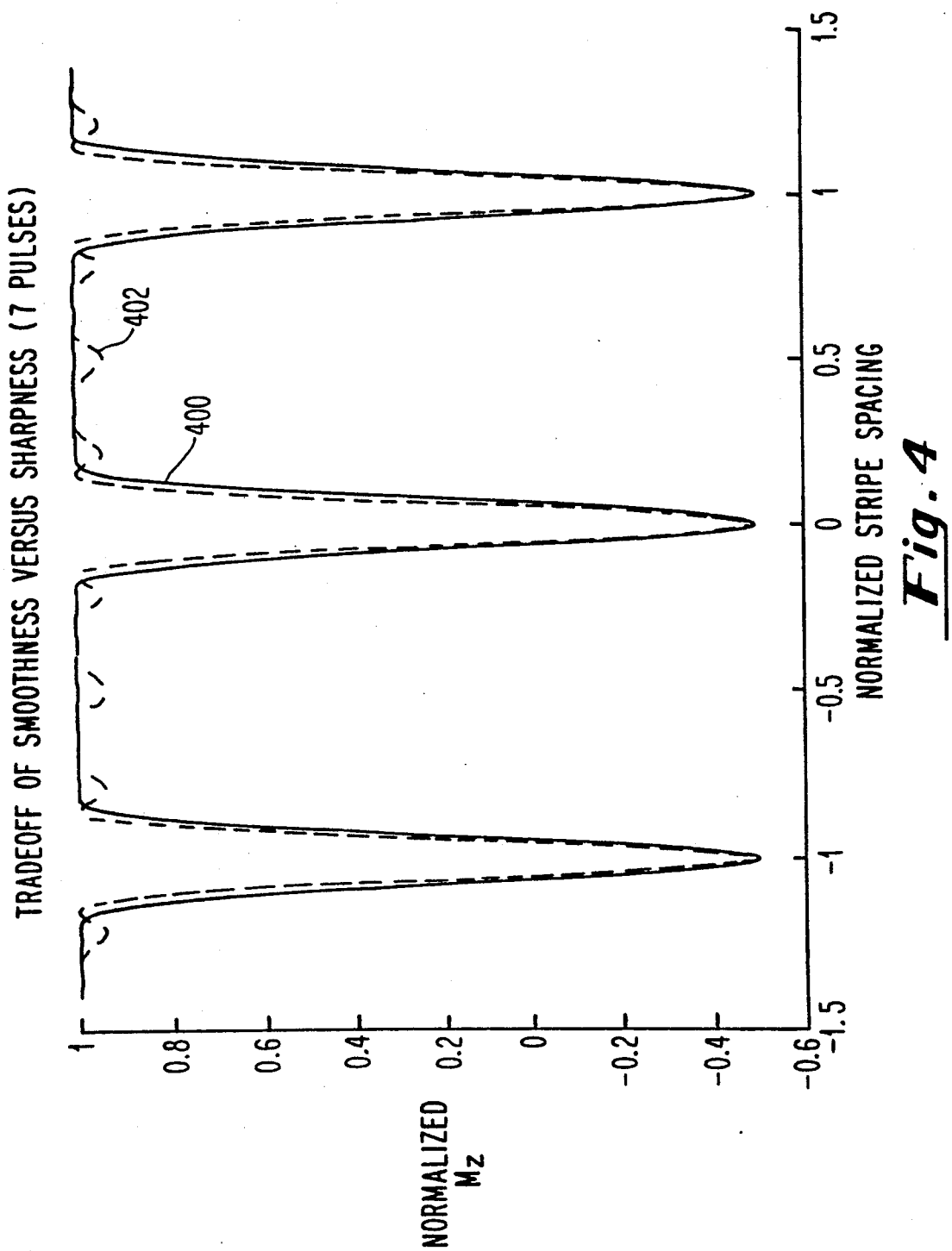
FIG. 4 is a diagram illustrating the effect of choosing a narrower stripe on the smoothness of the interstripe region.

4) Flatness. Away from the stripes, the image intensity should be minimally disturbed, so as not to interfere with the interpretation of the image. This can be specified in the pulse generation algorithm of the invention. Also, as shown in FIG. 4, there may be a tradeoff between flatness and sharpness, as increasingly sharp transitions lead to ripples. In other words, as shown in FIG.

4, the flatter pulse 400 is less sharp than the rippled pulse 402. The effect of a sharp transition can be modeled, so that one can choose an appropriate tradeoff.

5) Persistence. The stripes laid down should persist through the cardiac cycle, at least to the end of systole. This may be accomplished by using a flip angle of more than 90° to generate the stripes. This will lead to the stripes initially having a white center, as the middle is inverted more than 90°. The white stripe gradually disappears in the cardiac cycle. For example, a flip angle of 120° after a short delay will provide the same stripe as a 90° flip angle with a lesser delay.

6) Determination of the center. One would like to be able to measure the center of the stripe with some precision. The presence of a white line in the middle may help in this determination.

7) Duration of the pulse sequence. The pulse sequence should not be too long. The precise determination of what too long means can change, but one would like to devote not more than roughly 30 msecs to generating the stripes. That way one can lay them down at end diastole, with minimal cardiac motion during the generation of the stripes. In order to apply the pulses, one has to give the pulse, then cycle the gradients on and off, which takes roughly 2 msecs. This means that given limitations of the equipment, and that one is generating two orthogonal sets of stripes, one cannot use more than a 7 pulse sequence. Sometimes, even that can be too long, and one has to use a shorter sequence. However, one skilled in the art will appreciate that an instrument which can be cycled faster could use even longer pulse sequences. As shown in FIG. 4, if one could use more pulses, one could make even sharper stripes.

Sequences of 5 and 7 pulse trains were synthesized using the technique described herein for different frequency constraints. The pulse trains were then implemented on a GE Signa Research magnet as the encoding pulse train of a 1 dimensional SPAMM experiment, and applied to a copper sulfate phantom. The gradient pulses were applied between each pulse as in FIG. 1, and a dephasing gradient was applied at the end of the pulse train. An imaging sequence was then done. The images were photographed, their intensities measured, and the stripe width measured. The stripes resulting from one such pulse sequence are shown by way of example as curve 500 in FIG. 5. Curve 500 was generated as a seven pulse sequence having the following respective flip angles (summing to 120°): 12, 15.5, 20.7, 22.8, 20.8, 15.6 and 12.6. For comparison purposes, the stripes which resulted when a seven pulse binomial pulse sequence having the following respective flip angles (also summing to 120°): 1.9, 11.3, 28.1, 37.5, 28.1, 11.3 and 1.9, was applied to the same arrangement are shown in FIG. 5 as curve 502. From FIG. 5, it can be readily appreciated that the synthesized pulses were substantially better than the binomial pulses (i.e., sharp and flat).

Thus, the optimized pulses of the invention can significantly improve the SPAMM technique for cardiac imaging. Also, because the pulse values can be adjusted, a large family of pulse sequences with fairly similar performance can be generated by simply adjusting the relative weightings of the narrowness, sharpness, and flatness criteria. The operator is also given the opportunity to specify how much ripple or how little sharpness is tolerable. Furthermore, for any given z magnetization, one can synthesize many different pulse sequences (up to $2^{N-1}$, where N is the number of pulses) which yield the same z magnetization, depending on root selection in the phase retrieval part of the pulse generation algorithm. This can also be done independent of the gradient strength.

Although an exemplary embodiment of this invention has been described in detail above, those skilled in the art will readily appreciate that many additional modifications are possible in the exemplary embodiment without materially departing from the novel teachings and advantages of this invention. For example, the radio frequency pulses need not be applied along the same axis. They can instead be incremented in value to create a net phase shift. Also, since the pulses herein described are designed to the specifications of the observer, minor variations in the amplitude and phase of the optimal pulses are believed to be within the scope of the invention as herein described and claimed. In addition, the imaging described herein can be applied to a patient's blood or the patient's cerebrospinal fluid as well as the patient's heart wall to determine motion in accordance with the techniques of the invention. Accordingly, all such modifications are intended to be included within the scope of this invention as defined in the following claims.

We claim:

1. A method of detecting motion of an image slice of a body portion of a patient using a magnetic resonance imaging device, comprising the steps of:

inputting parameters specifying the desired visual characteristics of said image slice;

synthesizing a radio frequency pulse sequence which, when applied to said body portion prior to imaging by said magnetic resonance imaging device, will cause the creation of an image slice having said desired visual characteristics;

applying to the body portion an external magnetic field so as to produce a resultant magnetization;

applying a pre-imaging sequence to the body portion so as to spatially modulate transverse and longitudinal components of the resultant magnetization to thereby produce a spatial modulation pattern of intensity, said pre-imaging sequence comprising said synthesized radio frequency pulse sequence and magnetic field gradient pulses;

applying an imaging sequence to the body portion to make visible said spatial modulation pattern of intensity; and detecting motion of said body portion during a time interval between application of said pre-imaging and imaging sequences by examining displacements of the spatial modulation pattern of intensity occurring during said time interval.

2. The method as in claim 1, wherein said parameters include stripe thickness in said spatial modulation pattern of intensity.

3. The method as in claim 1, wherein said parameters include weights for relating sharpness and flatness of respective stripes in said spatial modulation pattern of intensity.

4. The method of claim 1, wherein said parameters include a number of radio frequency pulses to be included in said radio frequency pulse sequence.

5. The method of claim 1, wherein said parameters include a size of a transition zone between a striped and a non-striped region in said spatial modulation pattern of intensity.

6. The method of claim 1, wherein said pre-imaging sequence comprises said synthesized radio frequency pulse sequence with said magnetic field gradient pulses interspersed between respective radio frequency pulses of said synthesized radio frequency pulse sequence.

7. The method of claim 1, wherein said pre-imaging sequence comprises said synthesized radio frequency pulse sequence and overlapping magnetic field gradient pulses.

8. The method of claim 1, wherein said synthesized radio frequency pulse sequence is applied to said body portion so as to cause a selective periodic excitation of said resultant magnetization and said synthesized radio frequency pulse sequence comprises respective radio frequency pulses having amplitudes which are not related in accordance with a binomial amplitude function.

9. The method of claim 1, wherein said radio frequency pulse sequence is synthesized in accordance with the following steps:

calculating a fourier cosine series in $M_z$ which optimally fits said parameters, where $M_z$ is a magnetization response of said body portion to said radio frequency pulse sequence;

converting said Fourier cosine series into a complex exponential Fourier series;

generating a fourier series for spinor components of said complex exponential Fourier series of the form: $(1+M_z)/2 = P^2$ and $(1-M_z)/2 = Q^2$;

deconvoluting said Fourier series for spinor components to find P and Q; and calculating a radio frequency pulse sequence which yields a spinor with P and Q as its spinor components.

* * * * *